(12) United States Patent
Cheng

(10) Patent No.: US 6,963,210 B1
(45) Date of Patent: Nov. 8, 2005

(54) VARIOUS ELECTRICAL CHARACTERISTICS AND SMALL TEST POINT TESTING MODULE

(76) Inventor: Chin-Tsai Cheng, No.6-1, Hejiang 2nd Rd., Jnongli City, Taoyuan County 320 (TW)

( * ) Notice: Subject to any disclaimer, the term of this patent is extended or adjusted under 35 U.S.C. 154(b) by 0 days.

(21) Appl. No.: 11/086,457

(22) Filed: Mar. 23, 2005

(51) Int. Cl.$^7$ ............................................. G01R 31/02
(52) U.S. Cl. .................... 324/755; 324/158.1; 324/754
(58) Field of Search .................. 324/755, 765, 324/754, 758, 158.1, 761, 72.4; 439/66, 482

(56) References Cited

U.S. PATENT DOCUMENTS

| | | | | |
|---|---|---|---|---|
| 4,849,691 | A | * | 7/1989 | Siefers ........................ 324/755 |
| 5,453,701 | A | * | 9/1995 | Jensen et al. ................ 324/755 |
| 5,572,144 | A | * | 11/1996 | Davidson et al. ............ 324/755 |
| 5,729,146 | A | * | 3/1998 | Swart ........................ 324/754 |

* cited by examiner

Primary Examiner—Vinh Nguyen
Assistant Examiner—Jimmy Nguyen
(74) Attorney, Agent, or Firm—Rosenberg, Klein & Lee

(57) ABSTRACT

A various electrical characteristics and small test point testing module comprised of a carrier plate, a guide correction layer, a clamp pin layer, linear probes, first cushioning components, second cushioning components, travel adjustment rods, guide posts, and a base, wherein the carrier plate, the guide correction layer, and the clamp pin layer are capable of vertical ascension and descension along the same axis by means of the guide posts. The linear probes are inserted into the carrier plate, the guide correction layer, and the clamp pin layer such that their inner extremities are fixed at the clamp pin layer and their outer extremities are situated at the carrier plate position. The first cushioning components and the travel adjustment rods are disposed between the guide correction layer and the clamp pin layer, while the second cushioning components are disposed between the base and the clamp pin layer such that the carrier plate, the guide correction layer, and clamp pin layer all are supported by an elastic force and each linear probe is subjected to an equal magnitude of elastic force.

3 Claims, 8 Drawing Sheets

VARIOUS ELECTRICAL CHARACTERISTICS AND SMALL TEST POINT TESTING MODULE

BACKGROUND OF THE INVENTION

1) Field of the Invention

The invention herein relates to a various electrical characteristics and small test point testing module, specifically a kind capable of testing the various electrical characteristics of a range of electronic products that provides for high testing density, even lighter testing pressure, and stabler testing results. Furthermore, the present invention can be utilized as a testing module for testing different blank circuit boards or component mounted boards.

2) Description of the Prior Art

The methods for conducting tests of conventional electronic product-use circuit boards typically includes the following examples:

As indicated in FIG. 1 and FIG. 2, the prior art consists of an apparatus 1 base 11 having a needle plate 12, a clamp plate 13, a top plate 14, and a plurality of probes 2, wherein the said needle plate 12 needle holes 121 are aligned with the test points 31 of a tested object 3 (such as a printed circuit board); the said plurality of probes 2 each consisting of a probe barrel 21, a needle tube 22, a spring 23, and a needle body 24.

The said probe 2 probe barrel 21 is inserted into a needle hole 121 at a predetermined position on the needle plate 12 and a lead 4 is disposed at one end for signal transmission to a testing instrument (not shown in the drawings); the said spring 23 is contained inside the needle tube 22, the needle body 24 is inserted into the needle tube 22, the compression and decompression of the spring 23 enables the needle body 24 to elastically extend from and retract into the needle tube 22, and the said needle tube 22 is affixed within the probe barrel 21; as such, the said probe 2 can be completely positioned on the needle plate 12.

The said clamp plate 13 and top plate 14 each have insertion holes 131 and 141 that are aligned with the needle plate 12 needle holes 121 such that the needle bodies 24 inserted into the clamp plate 13 and top plate 14 insertion holes 131 and 141 protrude at the top plate 14.

As such, the tested object 3 is placed on the upper extent of the top plate 14, the tested object 3 test points 31 and the probe 2 needle bodies 24 are brought into contact, then the said electrical signal is sequentially transferred via the springs 23, the probe barrel 21, and the leads 4 connected at the probe barrel 21 bottom section to the testing instrument, thereby completing the testing operation.

Given the said arrangement, the prior art testing apparatus has the following drawbacks:

1. When the probe 2 contacts the tested object 3 test points 31, an elastic rebounding, compressive-decompressive force is required to prevent electrical damage to the test points 31 and, as a result, the needle body 24 relies on a spring 23 for withdrawal into the needle tube 22 such that the needle body 24 is automatically retracted elastically after compression and given such a structural arrangement, the entire probe 2 cannot be fabricated smaller or when fabricated smaller, the relative cost is very high, resulting in a cost increase and an inability to raise testing density.

2. Since the probe barrel 21 must be designed to match the dimensions of the probe 2, the dimensions are subject to limitations to the extent that the overall distribution density of the needle plate 12 needle holes 121 cannot be increased, resulting in an incapability to test high density testing point 31 tested objects 3.

3. Since the transferred signal of the tested object 3 testing point 31 results from the assembly and electrical contact of the needle body 24, the spring 23, the needle tube 22, and the probe barrel 21, poor and weak signal transmission results following numerous contacts and transfers that adversely affects testing quality, which become even more deteriorated when testing high density test points.

4. The probe 2 contacts the tested object 3 vertically and, as a result, the tip distance d of the adjacent probe 2 needle body 24 cannot be further reduced such that testing operations on tested objects 3 having small test points (i.e., test points 31 distributed at a higher density) cannot be accomplished.

In view of the said situations, manufacturers introduced the testing apparatus shown in FIG. 3 and FIG. 4 that consists of needle plates 5, lead plates 6, a plurality of linear probes 7, and a plurality of elastic components 8 disposed on the said apparatus, wherein the said needle plates 5 and lead plates 6 are in a stacked assembly, the said needle plates 5 consist of a plurality of guide correction plates 51 and a top plate 52, and the top plate 52 has the insertion holes 521 of the test points 31 of the tested object 3, and the said guide correction plates 51 have top plate insertion holes 521 that are aligned with the insertion hole 511; the said lead plates 6 consists of an upper layer, a middle layer, and a lower layer clamp plate 61, 62, and 63, with each having insertion holes 611, 621, and 631 drilled in them that are aligned with the guide correction plate insertion holes 511 of the needle plate 5, wherein the said middle layer clamp plate 62 insertion holes 621 contain an elastic component 8 and the said lower layer clamp plate 63 insertion holes 631 provide for connecting a inserted lead 4 between a testing instrument (not shown in the drawings) and the lower end of each elastic component 8; the said linear probes 7 are inserted along the needle plate 5 top plate insertion holes 521, the guide correction plate insertion holes 511, and the lead plate 6 upper layer plate 61 insertion holes 611, with their inner extremities postured against the elastic component 8 and the outer extremities exposed at needle plate top plate 52.

As such, the tested object 3 is placed on the upper extent of the needle plate 5 top plate 52 and since the testing instrument linear probes 7 and the test points 31 of the tested object 3 are brought into contact, the said electrical signal is sequentially transferred through the elastic components 8 and the testing instrument leads 4 to complete a testing operation.

Given the arrangement of such a testing apparatus, although the assembly of the probe needle body 24, spring 23, needle tube 22, and probe barrel 21 first required of the prior art is simpler in terms of method, the said angular placement of the linear probe 7 can be utilized for tested objects 3 having test points 31 distributed in a higher density and the prior art apparatus thus has an even larger scope of application. However, since electronic product volume is becoming more and more compact, requiring a testing density that is even higher, a testing pressure that is even lighter, and greater testing stability, under these conditions, such testing apparatus still have the following drawbacks:

1. After the linear probes 7 are respectively inserted vertically or angularly into the needle plate 5 such that their inner extremities are situated against the aligned elastic components 8, the height of their outer extremities are not equal (the outer extremities of vertically inserted probes are higher and the outer extremities of angularly inserted probes are lower), when the tested object 3 is subjected to pressure, the linear probe 7 contact pressure with the test points 31 changes, the tested object 3 is easily damaged due to unequal pressure, and testing is not stable, which are the prior art drawbacks most often criticized by manufacturers.

2. Since each linear probe 7 requires a matching elastic component 8 and, furthermore, the linear probe 7 is extremely small and the said elastic components 8 must be proportionately smaller; utilizing numerous small elastic components, in addition to troublesome fabrication and assembly, inconvenience, and high cost, the individual alignment of linear probe 7 elastic force often results in unequal linear probe 7 spring force, resulting in unequal testing pressure against tested object 3 test points 31 and testing instability.

3. Since the signals of the said linear probes 7 from the tested object 3 test points 31 must pass through the medium of the elastic components 8 before transfer to the testing instrument via the leads 4, the transmission of the said test signals is still poor and weak because there are too many connection points, which adversely affects testing quality and stability.

SUMMARY OF THE INVENTION

The primary objective of the invention herein is to provide a various electrical characteristics and small test point testing module in which the inner extremities of the linear probes are fixed at the clamp pin layer and the clamp pin layer is supported by second cushioning components and, therefore, the said linear probes are postured by an equal magnitude of elastic force against the tested object, thereby effectively increasing testing stability; at the same time, each linear probe does not have to equipped with an elastic component at their inner extremities, enabling testing apparatus component fabrication, assembly, and maintenance to be even simpler as well as more convenient, rapid, and economical.

Another objective of the invention herein is to provide a various electrical characteristics and small test point testing module in which after the inner extremities of the linear probes are fixed at the clamp pin layer, the height of their outer extremities accords with that of each aligned contact point of the tested object such that during testing operations, the said linear probes simultaneously contact and are aligned with the test points and, as such, the testing pressure and contact resistance for each test point is identical, which not only increases the degree of testing stability, but at the same time effectively reduces tested object damage.

Still another objective of the invention herein is to provide a various electrical characteristics and small test point testing module in which the said linear probe is capable of directly transferring the test signal to the testing instrument via leads without requiring an additional interfacing mediums, thereby significantly increasing test quality.

DETAILED DESCRIPTION OF THE PREFERRED EMBODIMENTS

Figure 1:
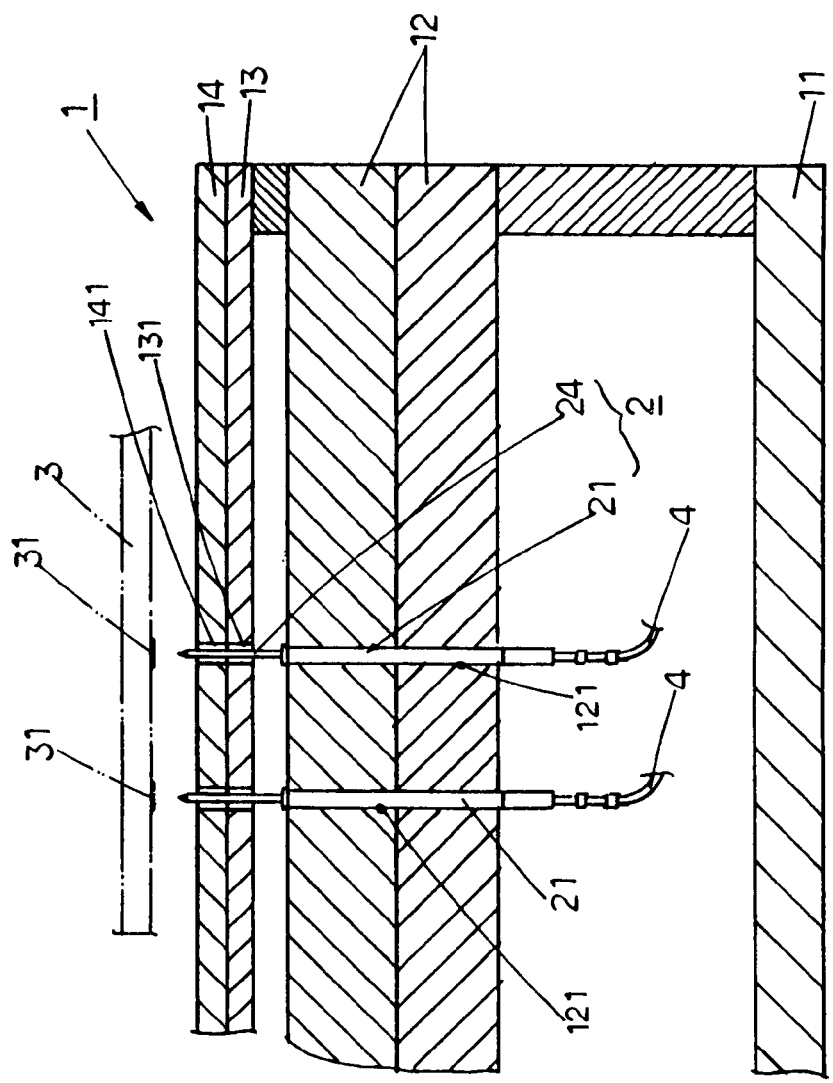
FIG. 1 is a cross-sectional drawing of the prior art testing apparatus (1)
Figure 2:
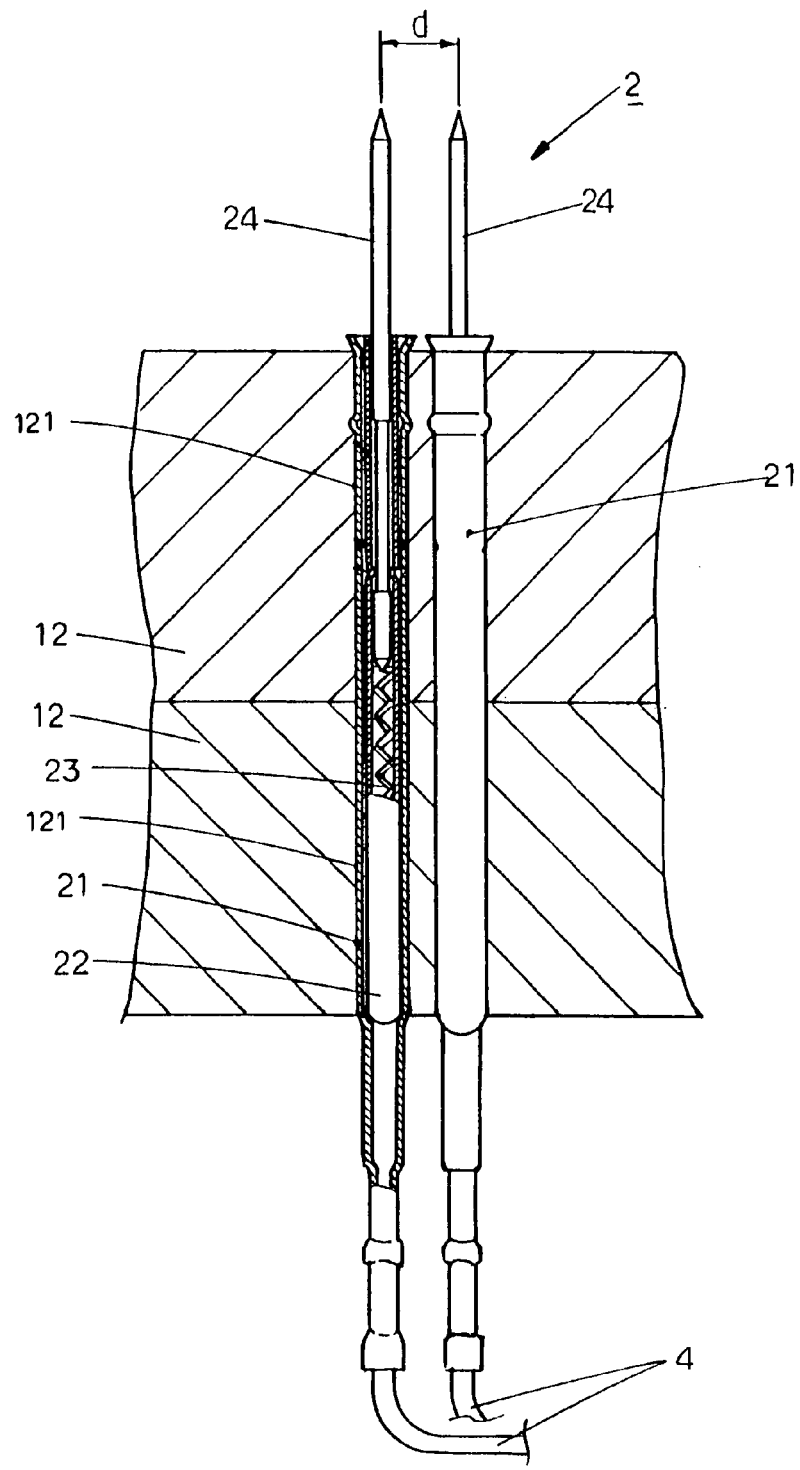
FIG. 2 is a cross-sectional drawing of the probe structure in FIG. 1.
Figure 3:
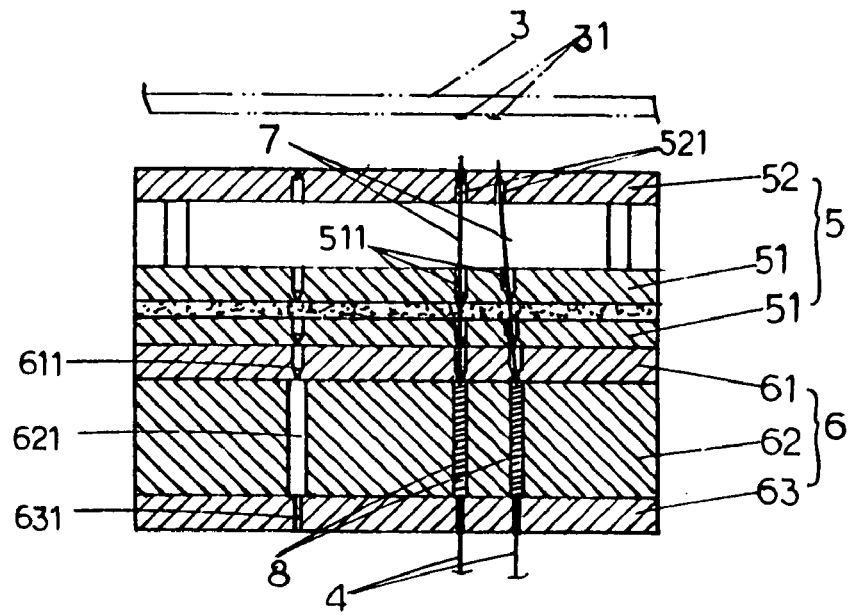
FIG. 3 is a cross-sectional drawing of the prior art testing apparatus (2).
Figure 4:
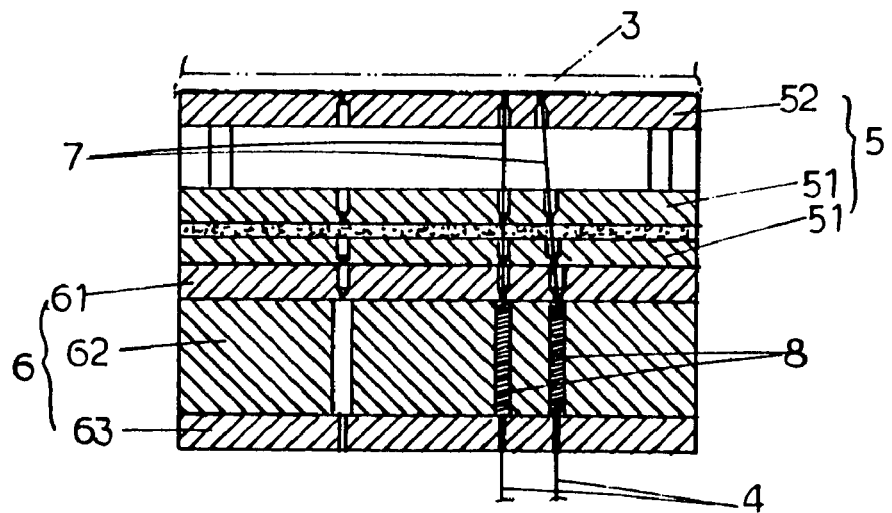
FIG. 4 is a cross-sectional drawing of the testing operation depicted in FIG. 3.
Figure 5:
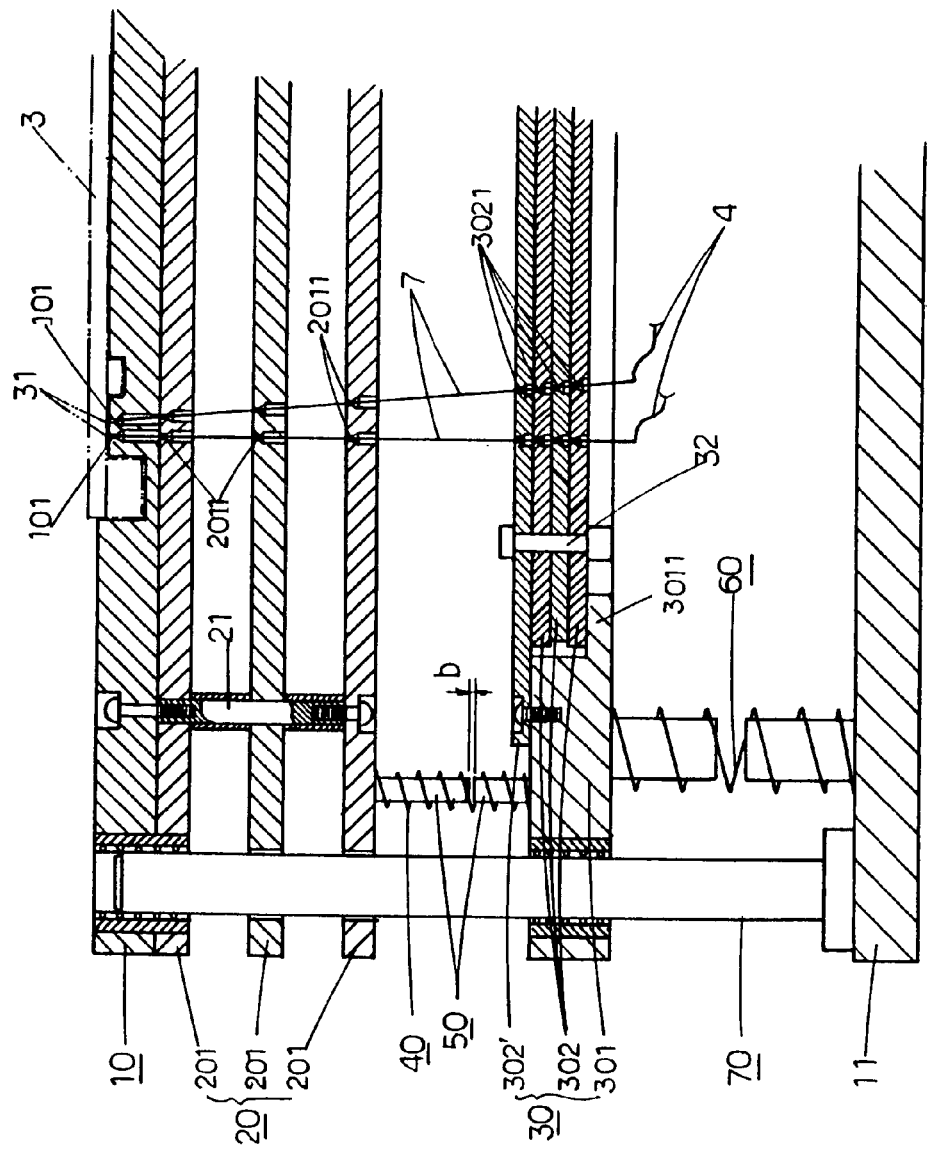
FIG. 5 is a cross-sectional drawing of an embodiment of the invention herein.
Figure 6:
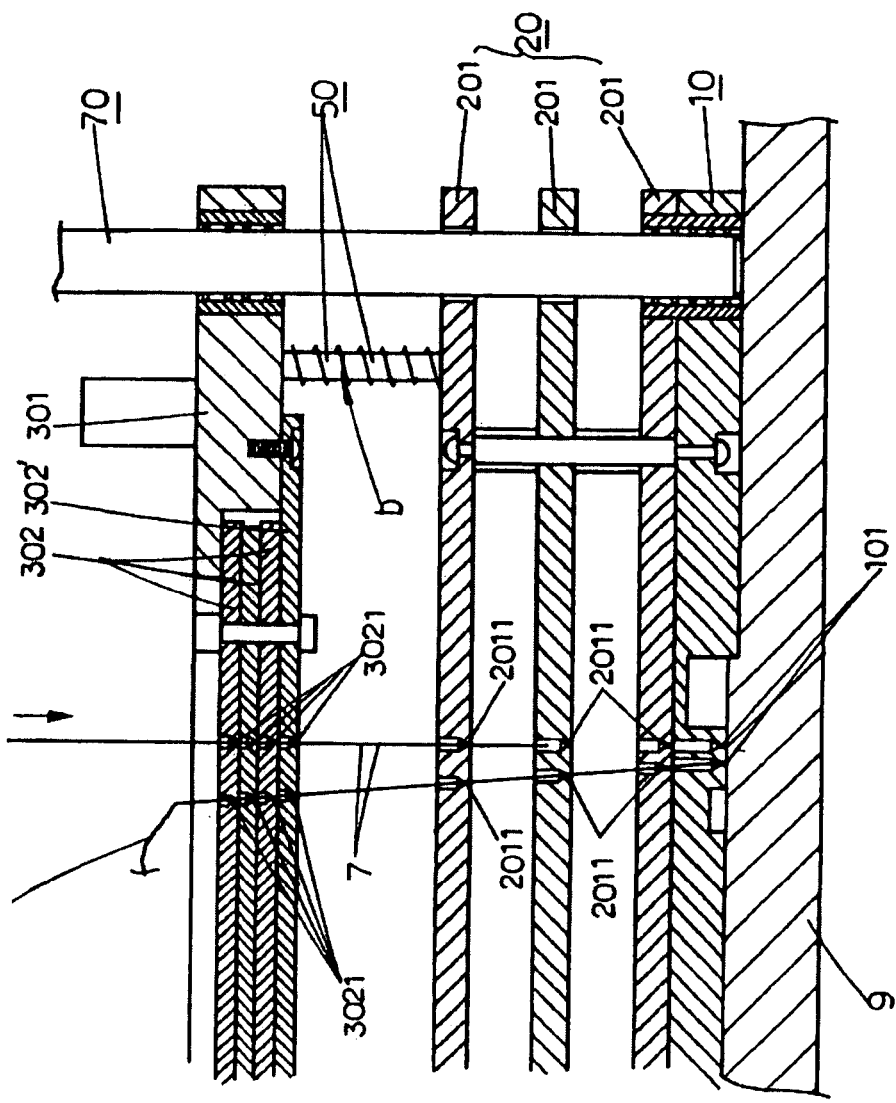
FIG. 6 is a cross-sectional drawing of the installed linear probe embodiment of the invention herein.

Referring to FIG. 5 and FIG. 6, the various electrical characteristics and small test point testing module of the invention herein is comprised of a carrier plate 10, a guide correction layer 20, a clamp pin layer 30, a linear probe 7, a first cushioning component 40, a travel adjustment rod 50, a second cushioning component 60, a guide post 70, and a base 11, wherein a said guide post 70 is installed at the four corners of the base 11 and the said carrier plate 10, guide correction layer 20, and clamp pin layer 30 are aligned by means of the guide posts 70 such that they are capable of vertical ascension and descension along the same axis.

The said carrier plate 10 is utilized to support and position a tested object 3 and has insertion holes 101 formed in it that are aligned with the test points 31 on the tested object 3 that provide for the pre-placement of linear probes 7.

The said guide correction layer 20 consists of a plurality of guide correction plates 201; each guide correction plate 201 is separated at an appropriate height by locating pins 21 anchored in the carrier plate 10 into a unitary body, and each guide correction plate 201 has guide correction holes 2011 that are in vertical or angular alignment with the carrier plate 10 insertion holes 101.

The said clamp pin layer 30 is situated along the inner side of the guide correction layer 20 and consists of a mounting frame 301 and a plurality of clamp pin plates 302, wherein the said mounting frame 301 consists of a center opening surrounded by a shoulder section 3011; the said plurality of clamp pin plates 302 are stacked on the mounting frame 301 shoulder section 3011 and fastened by mounting screws 32, with the outermost clamp pin plate 302' closest to guide correction layer 20 is also fastened onto the mounting frame 301, the insertion holes 3021 of which are in vertical or angular alignment with the guide correction layer 20 guide correction holes 2011.

A plurality of said linear probes 7 based on the quantity of tested object 3 test points 31 are respectively inserted into each clamp pin plate 302 (302') insertion hole 3021 of the clamp pin layer 30, each guide correction plate 201 guide correction hole 2011 of the guide correction layer 20, and the carrier plate 10 insertion holes 101 such that their outer extremities are aligned with the tested object 3 test points 31, their inner extremities are fixed at the clamp pin layer 30, and their leads 4 are respectively connected to a testing instrument (not shown in the drawings).

The said first cushioning component 40 is disposed in a plurality between the guide correction layer 20 and the clamp pin layer 30 such that there is a usable elastic force between the guide correction layer 20 and the carrier plate 10.

The said travel adjustment rod 50 is installed between the guide correction layer 20 and the clamp pin layer 30, and consists of a predisposed set interval b that determines the length of the linear probe 7 outer extremity extending away from the carrier plate 10, thereby controlling the pressure of the linear probe 7 against the testing point 31.

The said second cushioning component 60 can be larger than the first cushioning component 40 and is disposed in a plurality between the clamp pin layer 30 and the base 11 to thereby directly provide the linear probes 7 an equal magnitude of elastic force.

Utilizing the said arrangement of the invention herein, in the installation method of the said linear probes 7, referring again to FIG. 6, the fully assembled carrier plate 10, guide correction layer 20, and clamp pin layer 30 and guide posts 70 are turned over and a tested object simulator block 9 is first placed on them, the said clamp pin layer 30 is then pressed downward such that the travel adjustment rod 50 has no adjustment interval b, wherein, the tested object simulator block 9 can be a polished plate utilized at the height of the tested object 3 test points 31; or, the said tested object simulator block 9 surface fabricated according to the tested object 3 testing point 31 positions and height. As such, the said linear probes 7 are inserted downwards into each insertion hole 3021 of the clamp pin layer 30, guided through the aligned guide correction holes 2011 of the correction layer 20 guide correction plate 201, and inserted into the aligned insertion holes 101 of the carrier plate 10 such that their outer extremities are against the surface of the tested object simulator block 9, and after the linear probes 7 have been inserted into position, technical personnel fix the inner extremities at the clamp pin layer 30, thereby completing the simple installation operation of the said linear probes 7.

After the said linear probes 7 are installed, the technical personnel only have to take the fully assembled carrier plate 10, guide correction layer 20, and clamp pin layer 30 and install the guide posts 70 at the predetermined locations on the base 11 to complete the entire assembly operation of the testing module of the invention herein.

Figure 7:
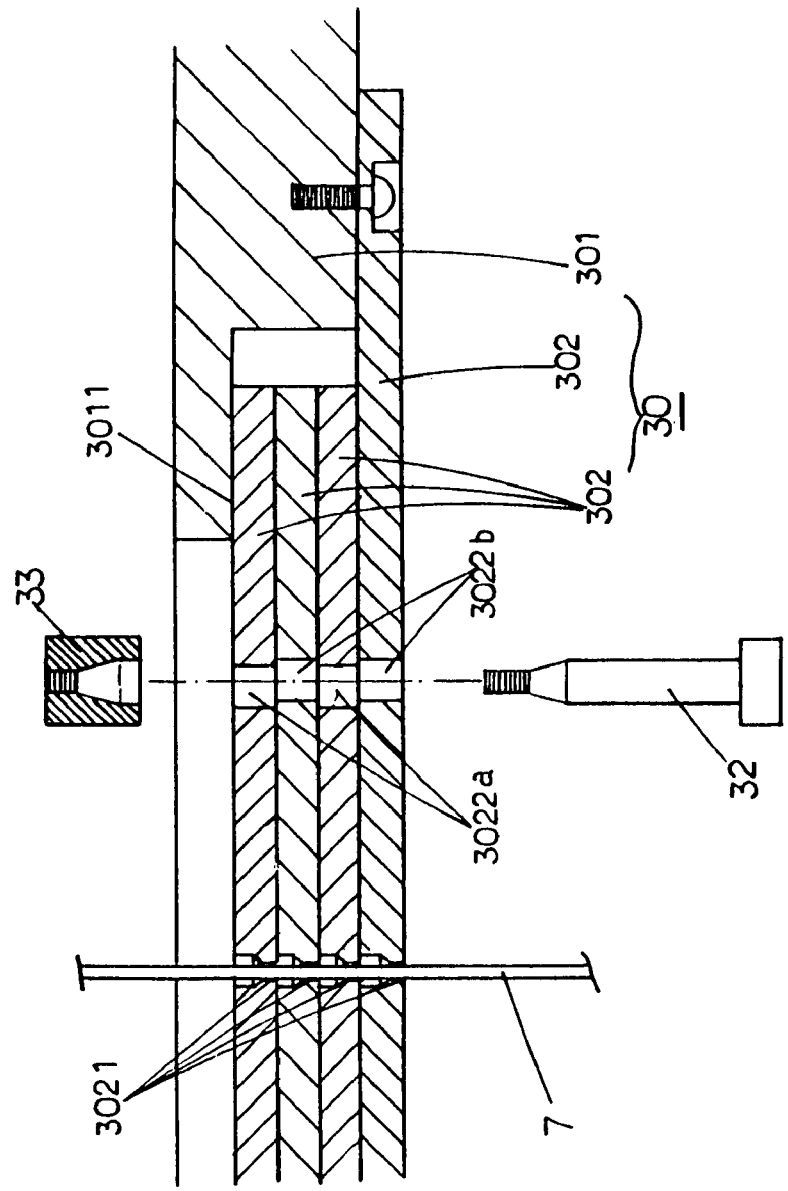
FIG. 7 is a cross-sectional drawing of the clamp pin layer-fixed linear probe embodiment of the invention herein.
Figure 8:
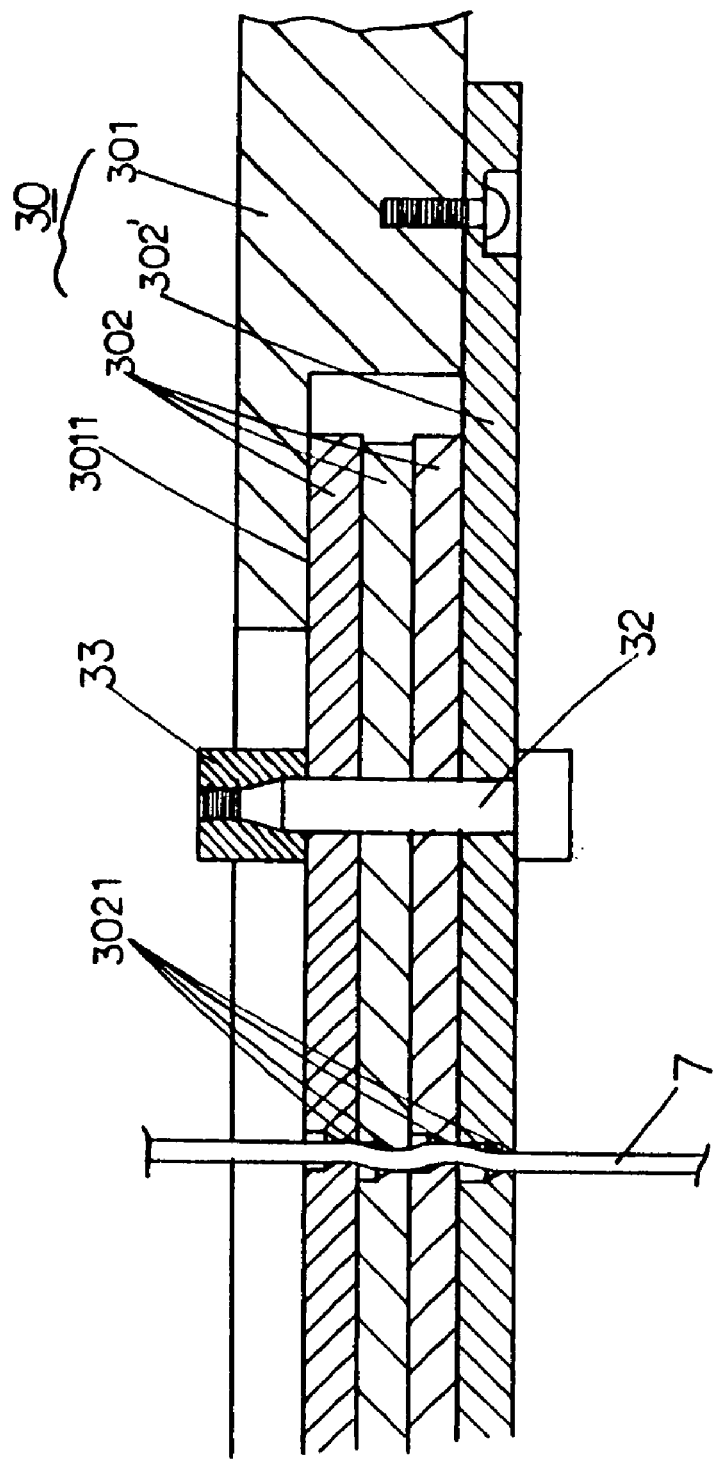
FIG. 8 is a cross-sectional drawing of the linear probe embodiment in FIG. 7.

Since the said linear probes 7 inner extremities inserted into the aligned insertion holes 3021 of the clamp pin layer 30 are fitted into position and not freely movable, but are not permanently set, it is only necessary to ensure that they are stationary; if the clamp pin layer 30 clamp pin plates 302 surfaces are coated with a heated layer of non-conductive solution or a layer of adhesive, after the said non-conductive solution or adhesive hardens, then each linear probe 7 is secured; or, as indicated in FIG. 7 and FIG. 8, aligned but offset insertion holes 3022a and 3022b are drilled at predetermined positions in each clamp pin plate 302 of the clamp pin layer 30, and utilizing a centering screw 32 that is inserted and a matching nut 33 fastened thereunto, the said clamp pin plates 302 stacked on the mounting frame 301 shoulder section 3011 are forced into horizontal movement to the same axis of alignment through each insertion hole 3022a and 3022b and, as such, when each said clamp pin plate 302 moves horizontally, the insertion holes 3021 originally providing for the insertion of the linear probes 7 become offset, the said inserted linear probes 7 following the insertion hole 3021 offsets such that they are snug-fitted into position (as shown in FIG. 8).

Figure 9:
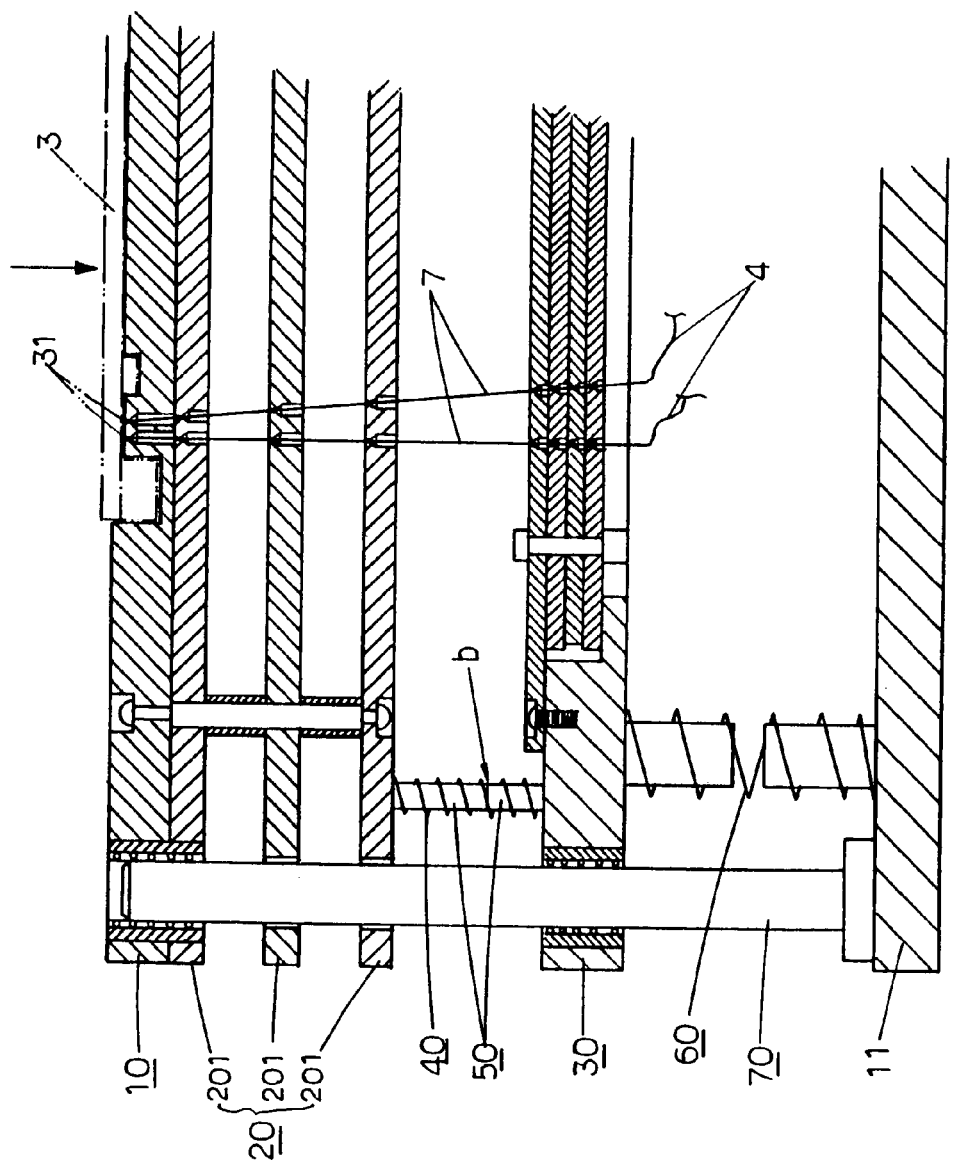
FIG. 9 is a cross-sectional drawing of the invention herein during a testing operation.

Referring to FIG. 9, when a tested object undergoes a test operation by the invention herein, the tested object 3 is placed at a predetermined location of the carrier plate 10, and when the testing apparatus applies pressure to the tested object 3, the said carrier plate 10 guide correction layer 20 is subjected to the elastic force of the first cushioning component 40 and elastically shifted inward, while the outer extremities of the linear probes 7 of fixing at clamp pin layer 30 become exposed and aligned with the test points 31, such that the test signals are directly transferred via the leads 4 to the test instrument.

When the carrier plate 10 and guide correction layer 20 are subjected to pressure continuously and elastically shifted inward until the travel adjustment rod 50 set interval b vanishes, the said clamp pin layer 30 is pressed inward, and the said clamp pin layer 30 is subjected to contact with the second cushioning component 60, the said clamp pin layer 30 now subjected to pressure and in which the linear probes 7 are retained is elastically shifted inward, such that the said clamp pin layer 30 linear probe 7 outer extremities are all against the tested object 3, not only protecting against the occurrence of damage and injury, but achieving an equal elastic force of application by the said linear probes 7.

Since the installed said linear probes 7 have their outer extremities postured against the tested object simulator block 9, whether the said linear probes 7 are vertically or angularly inserted, all of the outer extremities contact the aligned testing points 31 of the tested object 3 and, as such, when the said testing operation occurs and pressure is applied to the tested object 3, the carrier plate 10 and the guide correction layer 20 are elastically shifted inward, the exposed linear probes 7 simultaneously contact the aligned test points 31 such that the pressure at each test points 31 is identical and, furthermore, given that the pressure at each testing point 31 is the same, the said resulting contact resistance value is equal, thereby effectively ensuring a high degree of expected, required testing stability and lowering tested object damage rates.

Since the travel adjustment rod 50 is installed between the guide correction layer 20 and the clamp pin layer 30 and, furthermore, the set interval b left in the said travel adjustment rod 50 defines the distance of internal movement between the carrier plate 10 and the guide correction layer 20, when the tested object 3 on the said carrier plate 10 is subjected to testing pressure and travels over the set distance of internal movement, as previously mentioned, not only are the test points 31 tested under identical pressure as well as an equal contact resistance value with high testing stability and low tested object damage rates, the tested object 3 internal movement distance is also accurately set to the extent that the test points 31 will not be damaged by the excessive pressure contact of the linear probes 7 due to an overly large internal movement distance nor will poor testing contact by the linear probes 7 occur due to too small an internal movement distance, thereby increasing testing stability and protecting the tested object 3. In other words, the said travel adjustment rod 50 is capable of precisely setting the tested object 3 internal movement distance, and in the meantime the distance of the external of said linear probes 7 contacted to the test points 31 is given the precise setting, the pressure and contact resistance value the test points 31 are subjected to is not only totally equivalent, testing stability is extremely high and, at the same time, the said pressure is moderate and the test points are optimally protected and tested with greater precision for even more accurate testing results.

Since the said linear probes 7 are firmly disposed at the clamp pin layer 30 and the said clamp pin layer 30 is directly supported by the second cushioning components 60, in addition to furnishing the same magnitude of elastic force against the tested object 3 test points 31 as well as increasing testing quality and results, the said linear probes 7 do not require an elastic component for support as is the case with the prior art, the layout density totally prevents elastic component (spring) specification changes that occur in the prior art and, furthermore, can be of a further concentrated distribution and, as such, the said small test points (the extremely diminutive distances between adjacent test points) of each testing operation achieves full and, furthermore, effective utilization. In other words, the distribution of the said linear probes 7 is completely unlike that of the prior art which is limited by the specification of the supportive elastic components and can be of an even denser layout, the said approximately 10 mm-diameter large probe can be a tiny probe having a diameter as little as 0.03 mm that can be utilized with the invention herein, and the structure of the testing module of the invention herein can be directly utilized with smaller test points for various electrical characteristics testing operations (for example: flat blank board testing, component mounted board testing, high current, micro-circuit testing, and four-wire testing (absolute resistance value testing), etc.), thereby widening its scope of application.

Since the said linear probes 7 are generally provided an elastic force consisting of supportive clamp pin layer 30 second cushioning components 60, unlike the prior art which has numerous tiny springs respectively provided for each probe, the said second cushioning components 60 can be larger and, furthermore, disposed in lesser quantity, which is not only simpler, convenient, economical, more precise, and easier to control, but in terms of fabrication and maintenance, also even simpler, more convenient, and faster.

Since the said linear probes 7 do not each require the providing of elastic force via an elastic component, their inner extremities can be directly connected to testing instrument leads 4 and interfacing through additional mediums is unnecessary, test signal transmission improves upon the losses and poor performance of the prior art, thereby providing even more precision and ensuring high quality results.

What is claimed is:

1. A various electrical characteristics and small test point testing module comprised of a carrier plate, a guide correction layer, a clamp pin layer, a linear probe, a first cushioning component, a travel adjustment rod, a second cushioning component, a guide post, a base, and a tested object simulator block, wherein the said guide post is installed at the said base to provide for the vertical ascension and descension along the same axis of the said carrier plate, the said guide correction layer, and the said clamp pin layer; the said linear probe is utilized for testing a tested object; and a lead is used to transmit the test signal to a testing instrument, comprising:

the said carrier plate has prefabricated, aligned insertion holes that accord with the test points of the said tested object; the said guide correction layer consists of a plurality of guide correction plates that are separated at an appropriate height and disposed with the said carrier plate into a unitary body, and each guide correction plate has guide correction holes that are in vertical or angular alignment with the said carrier plate insertion holes; the said clamp pin layer is situated along the inner side of the said guide correction layer, the insertion holes of which are in vertical or angular alignment with the said guide correction layer guide correction holes; the said first cushioning component is disposed in a plurality between the said guide correction layer and the said clamp pin layer, thereby providing the elastic force for raising and lowering the said guide correction layer and the said carrier plate; the said linear probes, the plurality of which is based on the quantity of said tested object test points, are respectively inserted into the said clamp pin plate insertion holes, the guide correction plate guide correction holes, and the said carrier plate insertion holes such that their inner extremities are fixed at the said clamp pin layer and their outer extremities simultaneously contact and are aligned with the said test points when the said tested object undergoes testing; the said travel adjustment rod is installed between the said guide correction layer and the said clamp pin layer and has a predisposed set interval, such that it determines the distance of the said linear probe outer extremities at the said tested object and when the said carrier plate and the said guide correction layer are subjected to pressure for internal movement; the said second cushioning component is disposed between the said clamp pin layer and the said base to thereby directly provide an equal magnitude of elastic force to the said linear probes fixed onto the said clamp pin layer; one end of the said lead is connected to the testing instrument and the other end is directly installed to the said linear probe inner extremity; the said tested object simulator block is stacked on the bottom surface of the overturned said carrier plate, its surface defined by the positions and height of the said tested object test points and disposed in an identical state such that when the said linear probes are installed, their outer extremities can be utilized against test point;

whereby, when pressure is applied to the said tested object on the said carrier plate during a testing operation, the said carrier plate and the said guide correction layer undergo elastic internal movement until the outer extremities of the said linear probes extend to the set length and under equal elastic pressure simultaneously contact and are aligned with the said test points, with test signals then transmitted to the testing instrument via the said leads installed at the inner extremities of the said linear probes.

2. A various electrical characteristics and small test point testing module as recited in claim 1, the said clamp pin layer consists of a mounting frame and a plurality of said clamp pin plates, the said mounting frame consists of a center opening surrounded by a shoulder section, and the said plurality of clamp pin plates are stacked on the said mounting frame shoulder section, with the outermost said clamp pin plate closest to the said guide correction layer fastened onto the said mounting frame, and each said clamp pin plate has the said insertion holes which are in vertical or angular alignment with the said guide correction layer guide correction holes that provide for the insertion of the said linear probes, with aligned and, furthermore, offset insertion holes drilled at predetermined positions, enabling the insertion of a centering screw having a matching nut fastened thereunto to articulate the said clamp pin plates stacked on the said mounting frame shoulder section into horizontal movement and thereby provide for snug-fitting said the linear probes inserted into the said clamp pin plate insertion holes.

3. A various electrical characteristics and small test point testing module as recited in claim 1 or claim 2, after the said linear probes are inserted into the said clamp pin layer insertion holes, the said clamp pin layer surface is coated with a layer of adhesive or non-conductive solution.

* * * * *